United States Patent [19]
Ueno et al.

[11] 4,100,410
[45] Jul. 11, 1978

[54] APPARATUS FOR SELECTING THE FIELD OF VIEW OF A SAMPLE

[75] Inventors: Yukichi Ueno; Toshiaki Nakata, both of Katsuta, Japan

[73] Assignee: Hitachi, Ltd., Tokyo, Japan

[21] Appl. No.: 753,206

[22] Filed: Dec. 22, 1976

[30] Foreign Application Priority Data

Dec. 24, 1975 [JP] Japan .................. 50-153251

[51] Int. Cl.² .......................................... G01M 23/00
[52] U.S. Cl. .................................. 250/311; 250/399; 250/400; 250/492 R
[58] Field of Search ............... 250/396, 397, 334, 400, 250/492 A, 492 B, 492 R, 399, 311; 315/367

[56] References Cited

U.S. PATENT DOCUMENTS

| 3,341,735 | 9/1967 | Briggs | 315/367 |
| 3,758,825 | 9/1973 | Kapers | 315/367 |
| 3,889,115 | 6/1975 | Tamura et al. | 250/309 |

Primary Examiner—Harold A. Dixon
Attorney, Agent, or Firm—Beall & Jeffery

[57] ABSTRACT

Electric pulses are counted, and are converted into an electric signal proportional to the number of the counted pulses. An electron beam for irradiating a sample is deflected in response to the electric signal. The counting can be voluntarily stopped with a switch.

6 Claims, 1 Drawing Figure

APPARATUS FOR SELECTING THE FIELD OF VIEW OF A SAMPLE

BACKGROUND OF THE INVENTION (1) Field of the Invention

This invention relates to an apparatus for selecting the field of view of a specimen or sample, and more particularly to an apparatus for selecting the field of view of a sample as is suitable for use in a scanning electron microscope, an electron probe X-ray microanalyzer, an ion microanalyzer, etc.

(2) Description of the Prior Art

In the scanning electron microscope, the electron probe X-ray microanalyzer etc., a sample is scanned in two dimensions by an electron beam, and the image of the scanned region of the sample is displayed on an displaying device on the basis of an information signal peculiar to the sample (for example, secondary electrons, backscattered or reflected electrons, absorbed electrons, Auger electrons, X-rays, cathode luminescence, etc.) as obtained from the sample by the scanning. Likewise, in the ion microanalyzer, the display of the image of a sample is often performed. In this case, however, a beam to irradiate or bombard the sample is an ion beam, and secondary ions are often employed as the information signal peculiar to the sample as obtained therefrom.

In such apparatus, it is necessary to frequently select that region or position of the sample for observation which is to be irradiated by the irradiation beam, in other words, to frequently select the field of view of the sample. The method for the selection includes the so-called mechanical system in which the sample is moved, and the so-called electrical system in which the sample is kept stationary and the irradiation beam is electrically deflected. Both the systems have merits and demerits. By way of example, when the electrical system is employed where the range of selecting the field of view is very wide or where the magnification for the observation is very low, the irradiation beam need be largely deflected, and hence, it is sometimes impossible to neglect the problem of aberration. From such standpoint, accordingly, it can be said that the mechanical system is more advantageous. The mechanical system, however, is attended with such problems that the use of a lubricant which is necessary for smoothly driving the sample but which is unfavorable for a vacuum equipment is inevitable, that the reliability lowers due to the abrasion of moving elements, and that a complicated sample driving mechanism which is a hindrance to the high vacuum of the surroundings of the sample must be arranged around the sample. Accordingly, in a range in which the problem of aberration is negligible, it is advantageous to employ the electrical system which is less subject to the problems than the mechanical system.

A conventional, sample-view selecting apparatus of the electrical system comprises a deflection coil, a current source which converts a voltage into a current and which supplies the current to the deflecting coil, and potentiometers for changing the voltages. As the potentiometer, there is generally used one which consists of a wound type slide resistance and slider adapted to slide on the surface thereof. When the potentiometer is regulated to change the current flowing through the deflecting coil, the irradiation beam to irradiate the sample is deflected accordingly. In this way, therefore, the field of view of the sample can be selected.

In such electrical, sample-view selecting apparatus, however, the lowering of reliability and the shortening of life ascribable to the abrasion of the slide portions of the potentiometer are serious problems because the operation of selecting the field of view of the sample must be frequently carried out.

SUMMARY OF THE INVENTION

An object of this invention is to provide a sample-view selecting apparatus of the electrical system.

Another object of this invention is to provide a sample-view selecting apparatus which has no mechanical sliding portion and which can accordingly solve the problems of the lowering of reliability and the shortening of associated with a mechanical system.

Still another object of this invention is to provide a sample-view selecting apparatus in which the operation of selecting the field of view of a sample is easy.

According to the sample-view selecting apparatus of this invention, electric pulses are counted, and an electric signal corresponding to the number of the counted pulses is generated. The electric signal is employed in order to deflect an irradiation beam for irradiating a sample.

Other objects and features of this invention than mentioned above will become apparent from the following description taken with reference to the drawing.

BRIEF DESCRIPTION OF THE DRAWING

The single FIGURE.

DESCRIPTION OF THE PREFERRED EMBODIMENT

Figure 1:
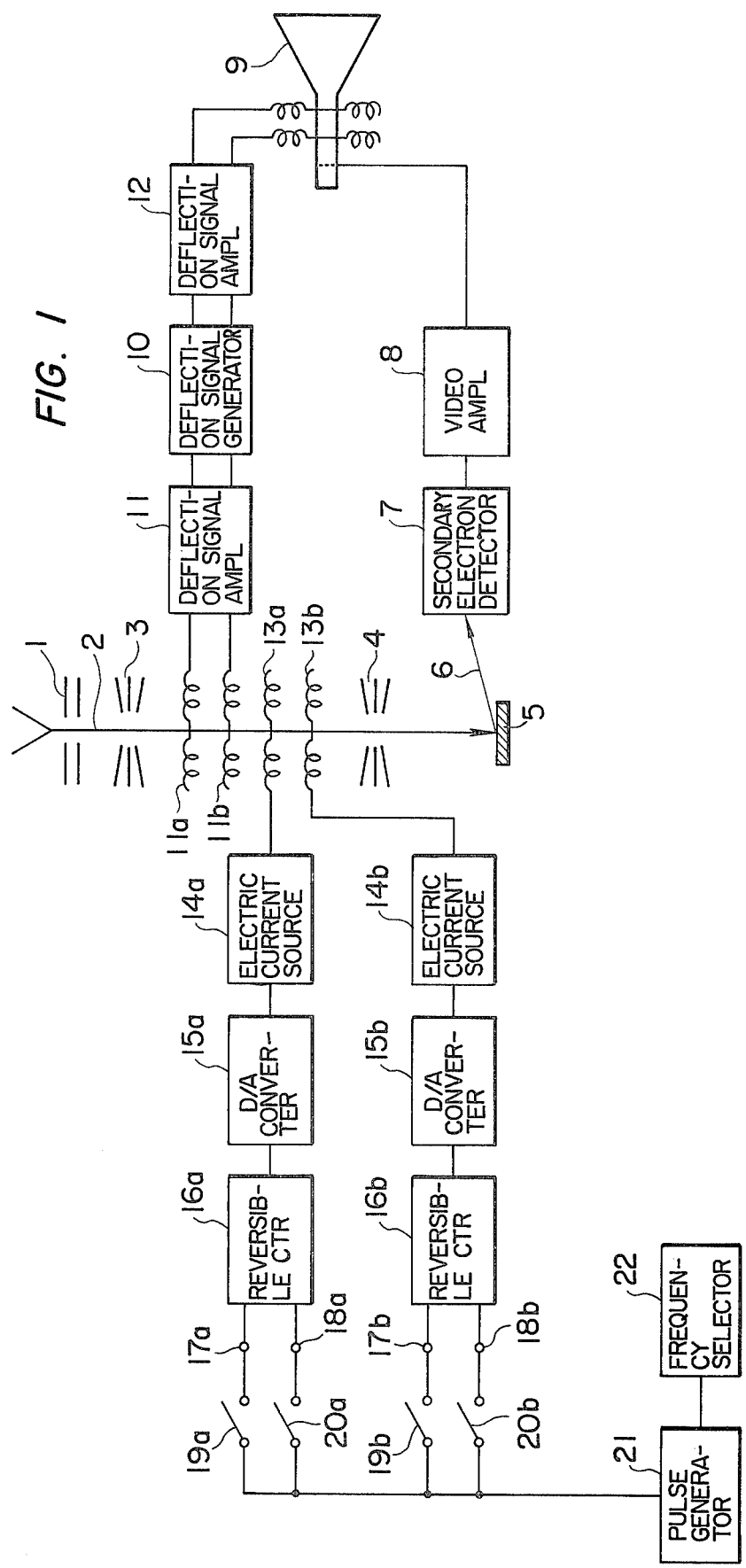
FIG. 1 is a block diagram of an example of a scanning electron microscope which is equipped with a sample-view selecting apparatus embodying this invention.

Referring to FIG. 1, an electron beam 2 generated from an electron gun 1 is focused onto a sample 5 by a condenser lens 3 and an objective lens 4. Thus, an information signal peculiar to the sample 5, such as secondary electrons, reflected electrons, absorbed electrons, Auger electrons, X-rays and cathode luminescence, is obtained from the sample 5. To take secondary electrons as an example of such information, the secondary electrons 6 are detected and converted into an electric signal by a secondary electron detector 7. The electric signal is amplified as video signal by video amplifier 8, whereupon it is introduced into a grid which is a brightness modulating electrode of a cathode ray tube 9.

On the other hand, deflection signals for X-axis and Y-axis are generated by X-axial and Y-axial deflection signal generator 10, they are amplified by a deflection signal amplifier 11, and they are respectively supplied to deflector coils 11a and 11b for the X-axis and Y-axis, respectively. Thus, the electron beam 2 is deflected in two dimensions. Accordingly, the sample 5 is scanned in two dimensions by the electron beam 2. The X-axial and Y-axial deflection signals from the X-axial and Y-axial deflection signal generator 10 are also amplified by a deflection signal amplifier 12 and fed to X-axial and Y-axial deflector coils of the cathode ray tube 9. Thus, cathode rays (electron beam) of the cathode ray tube 9 are also deflected in two dimensions in synchronism with the two-dimensional deflection of the electron beam 2. Accordingly, a screen of the cathode ray tube 9 is also scanned in two dimensions in synchronism with the two-dimensional scanning of the sample 5. In this way, the image of the two-dimensional scanned region of the sample 5 as based on the secondary electrons is displayed on the screen of the cathode ray tube 9.

The embodiment in FIG. 1 is provided with auxiliary deflector coils 13a and 13b for the X-axis and Y-axis, respectively, and which serve to deflect the electron beam 2. Electric current sources 14a, 14b, digital-to-analog converters 15a, 15b and reversible counters 16a, 16b are successively connected to the respective auxiliary deflector coils 13a and 13b. The reversible counters 16a, 16b are respectively equipped with count incrementing terminals 17a, 17b and count decrementing terminals 18a, 18b, which are respectively connected to a pulse generator 21 through switches 19a, 19b and 20a, 20b. A frequency varying unit or frequency selector 22 for varying the frequency of electric pulses is also connected to the pulse generator.

When the switch 19a is closed, the electric pulses from the pulse generator 21 are impressed on the reversible counter 16a through the count incrementing terminal 17a. Here, the electric pulses are counted in the direction of increasing. The incrementally counted value becomes an input signal of the digital-to-analog converter 15a as a digital quantity, and it is converted here into a voltage being an analog quantity that is proportional to the number of the incrementally counted pulses. The voltage becomes an input of the current source 14a, and is converted here into a current proportional to the voltage. The current is supplied to the X-axial auxiliary deflector 13a. Thus, the electron beam 2 is deflected in the X-axial direction, and accordingly, the position of irradiation of the sample 5 by the electron beam 2 changes, so that the image displayed on the screen of the cathode ray tube 9 moves in the X-axial direction. The movement contiunes as long as the switch 19a is kept closed. By opening the switch 19a when an image in which an observer becomes interested through the observation of the moving image or an image at which the observer aims appears on the screen of the cathode ray tube 9, the image can be reliably brought to a standstill at that time. This comes from the fact that, by opening the switch 19a, the incremental counting in the reversible counter 16a is reliably stopped at that time. Since the moving speed of the image is proportional to the counting rate of the pulses in the reversible counter 16a, the movement of the image can be executed at a desired speed by changing the frequency of the electric pulses of the pulse generator 21 by the frequency selector 22.

In the case of closing the switch 20a in place of the switch 19a, the situation is similar to that in the case of closing the switch 19a. The only different is that the reversible counter 16a counts the pulses in the decremental direction in the case of closing the switch 20a, i.e., that on account of the decremental counting, the sense of the movement of the image becomes converse to that in the case of closing the switch 19a. It is thus understood that the movement of the image in the X-axial direction and the stop thereof can be simply executed merely by the operations of opening and closing the switches 19a and 20a.

On the other hand, the movement of the image in the Y-axial direction orthogonal to the X-axial direction and the stop thereof can also be simply executed merely by the oprations of opening and closing the switches 19b and 20b. More specifically, when either the switch 19b or 20b is selectively closed, the electric pulses from the pulse generator 21 are counted by the reversible counter 16b, an output signal of the reversible counter 16b representative of the number of the counted pulses is converted by the digital-to-analog converter 15b into an analog voltage proportional to the number of the pulses, the voltage is converted by the current source 14b into a current proportional to the voltage, and the current is supplied to the Y-axial auxiliary deflector 13b. When the switch 19b is closed, the reversible counter 16b counts the electric pulses in the incremental direction, whereas when the switch 20b is closed, the reversible counter 16b counts them in the decremental direction. Therefore, although the image moves in the Y-axial direction in both the case of closing the switch 19b to perform the incremental counting and the case of closing the switch 20b to perform the decremental counting, the senses of the movements become opposite to each other. By opening the switch 19b or 20b, the movement of the image is reliably stopped at that time.

Accordingly, the selection of the field of view of the sample can be freely and reliably carried out merely by the operations of opening and closing the switches 19a, 19b and 20a, 20b, in other words, the operations of opening and closing the switches for the counting of the electric pulses and the stopping thereof.

As readily understood from the above description, the embodiment in FIG. 1 does not include any slide portion as in the prior-art apparatus at all. Accordingly, the problems of the lowering of reliability and the shortening of life ascribable to abrasion as in the prior-art apparatus are perfectly solved.

In the prior-art sample-view selecting apparatus of the electrical system as previously stated, the selection of the field of view must be conducted by moving the sliders of the potentiometers. In contrast, in the embodiment of FIG. 1, the selection can be conducted merely by the operations of opening and closing the switches for the counting of the electric pulses and the stopping thereof, and the operations are very simple.

The moving speed of the image in the selection of the field of view of the sample is proportional to the magnification of the image. Accordingly, in case where it is desired to hold the moving speed of the image substantially constant even at different magnifications, the operator must control the speed of the motion of the potentiometer in the foregoing prior-art sample-view selecting apparatus of the electrical system. In actuality, however, the control operation is very difficult. In contrast, in the embodiment of FIG. 1, the moving speed of the image varies by varying the counting rate of the electric pulses and in proportion thereto, and there is known in advance that relation between the magnification and the counting rate of the electric pulses in which the moving speed of the image is kept substantially constant even when the magnification is changed. Therefore, the selection of the field of view of the sample can be simply effected at an appropriate sample moving speed corresponding to the magnification merely by the change-over to the counting rate of the electric pulses corresponding to the magnification used, accordingly the frequency of the electric pulses and the opening and closing operations of the switches for the counting of the electric pulses and the stopping thereof, and even without providing means for interlocking the change-over of the magnification and the change-over of the pulse counting rate.

In the embodiment of FIG. 1, the image moves when the switch 19a, 19b, 20a or 20b is closed. As is obvious to those skilled in the art, however, this aspect can be altered to an aspect in which by employing, for example, relays, the image is moved when the switch 19a, 19b, 20a or 20b is opened. Although, in the embodiment of FIG. 1, the auxiliary deflectors 13a, 13b for the selection of the field of view of the sample are provided separately from the deflectors 11a, 11b for scanning the sample 5, the auxiliary deflectors 13a, 13b can be omitted in such a way that the output currents of the current sources 14a, 14b are superposed in the form of d.c. on the X-axial and Y-axial deflecting signals to be supplied to the deflector coils 11a, 11b. Further, although in the embodiment of FIG. 1 the irradiation beam for irradiating the sample is the electron beam, it may well be an ion beam. This signifies that the invention is also applicable to the ion micronanalyzer. Of course, in this case, the secondary ions are often employed as the information signal to be obtained from the sample as is well known.

We claim:

1. Apparatus for selecting the field of view of a sample, comprising means for irradiating the sample by an irradiation beam, means for generating electric pulses, means capable of counting said electric pulses both incrementally and decrementally and for generating an electric signal corresponding to the number of the counted pulses, means for deflecting said irradiation beam to irradiate said sample in response to said electric signal, and means for stopping the incremental counting and the decremental counting independently.

2. The apparatus for selecting the field of view of a sample according to claim 1, further comprising means for varying the frequency of said electric pulses.

3. Apparatus for selecting the field of view of a sample, comprising: means for irradiating the sample by an irradiation beam; means for generating electric pulses; and first and second channels each of which includes means capable of counting said electric pulses both incrementally and decrementally and for generating an electric signal corresponding to the number of the counted pulses, means for deflecting said irradiation beam to irradiate said sample in response to said electric signal, and means for stopping the incremental counting and the decremental counting independently; said means for deflecting in said first and second channels each deflecting said irradiation beam to irradiate said sample in directions substantially orthogonal to each other.

4. The apparatus for selecting the field of view of a sample according to claim 3, further comprising means for varying the frequency of said electric pulses.

5. Apparatus for selecting the field of view of a sample, comprising; means for irradiating the sample by an electron beam; means for generating electric pulses whose frequency is variable; and first and second channels each of which includes a reversible counter capable of counting said electric pulses both incrementally and decrementally, switch means for stopping the incremental counting and decremental counting independently, means for deriving an analog electric signal proportional to the number of the counted electric pulses, and means for deflecting said electron beam to irradiate said sample in response to said analog electric signal; said means for deflecting in said first and second channels each deflecting said electron beam to irradiate said sample in directions orthogonal to each other.

6. The apparatus for selecting the field of view of a sample according to claim 5, further comprising means for scanning said sample in two dimensions by said electron beam, and means for displaying an image of that region of said sample which is scanned by said electron beam, on the basis of an information signal peculiar to said sample as obtained therefrom by the scanning thereof.

* * * * *